(12) United States Patent
Toben et al.

(10) Patent No.: US 6,383,269 B1
(45) Date of Patent: May 7, 2002

(54) ELECTROLESS GOLD PLATING SOLUTION AND PROCESS

(75) Inventors: Michael P. Toben, Smithtown; James L. Martin, Merrick, both of NY (US); Yasuo Ohta, Tokyo (JP); Yasushi Takizawa; Haruki Enomoto, both of Saitama (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/490,928

(22) Filed: Jan. 25, 2000

Related U.S. Application Data

(60) Provisional application No. 60/117,715, filed on Jan. 27, 1999.

(51) Int. Cl.$^7$ .............................. C23C 18/52; B22F 7/00
(52) U.S. Cl. .................. 106/1.23; 106/1.26; 427/443.1; 427/437
(58) Field of Search ............................... 106/1.23, 1.26, 106/437; 427/437, 443.1

(56) References Cited

U.S. PATENT DOCUMENTS

| | | | |
|---|---|---|---|
| 3,032,436 A | 5/1962 | Gostin et al. ............... 106/1.26 |
| 3,753,874 A | 8/1973 | Zimmerman et al. .......... 204/43 |
| 4,352,690 A | * 10/1982 | Dettke et al. ............... 106/1.23 |
| 4,374,876 A | * 2/1983 | El-Shazly et al. .......... 106/1.23 |
| 4,481,035 A | * 11/1984 | Andrascek et al. ......... 106/1.23 |
| 4,804,559 A | 2/1989 | Ushio et al. .................... 427/96 |
| 4,830,668 A | * 5/1989 | Wundt et al. ................ 106/1.23 |
| 5,178,918 A | * 1/1993 | Duva et al. ................. 106/1.23 |
| 5,202,151 A | 4/1993 | Ushio et al. .................... 427/98 |
| 5,232,492 A | 8/1993 | Krulik et al. ............... 106/1.23 |
| 5,318,621 A | 6/1994 | Krulik et al. ............... 106/1.23 |
| 5,364,460 A | * 11/1994 | Morimoto et al. ......... 106/1.23 |
| 5,470,381 A | 11/1995 | Kato et al. ................. 106/1.23 |
| 5,645,628 A | * 7/1997 | Endo et al. ................. 106/1.23 |
| 5,803,957 A | * 9/1998 | Murakami et al. ......... 106/1.23 |
| 5,935,306 A | * 8/1999 | Reed .......................... 106/1.23 |
| 6,183,545 B1 | * 2/2001 | Okuhama et al. .......... 106/1.23 |

FOREIGN PATENT DOCUMENTS

| | | |
|---|---|---|
| DE | 3614090 | * 4/1986 |
| JP | 59006365 | * 1/1984 |
| JP | 8-253872 | 10/1996 |
| JP | 9-157859 | 6/1997 |
| JP | 9-287077 | 11/1997 |
| JP | 11-12753 | 1/1999 |
| JP | 2000-17448 | 1/2000 |
| JP | 2000-345359 | 12/2000 |
| WO | WO 99/18254 | 4/1999 |

OTHER PUBLICATIONS

Derwent abstract of DE 3614090, Apr. 1986.*
Derwent abstract of DD 268484, Dec. 1983.*
Derwent abstract of JP59/006365, Jan. 1984.*
Derwent abstract of DD 265915, Mar. 1989.*
Database WPI, Section Ch, Week 199026, Derwent Publications Ltd., London, GB; Class M11, AN 1990–198989, XP002180242 & JP 02 133594 A (Shinko Denki Kogyo KK) May 22, 1990, *abstract*.
Patent Abstracts of Japan, vol. 009, No. 278 (C–312), Nov. 6, 1985 & JP 60 125379 A (Shinkou Denki Kogyo KK) Jul. 4, 1985, *abstract*.
Patent Abstracts of Japan, vol. 015, No. 496 (C–0894), Dec. 16, 1991 & JP 03 215677 A (N E Checat Corp.), Sep. 20, 1999, *abstract*.

* cited by examiner

*Primary Examiner*—Helene Klemanski
(74) *Attorney, Agent, or Firm*—S. Matthew Cairns

(57) ABSTRACT

Electrolyte compositions useful for forming gold coatings on nickel containing substrates are disclosed. Also disclosed are methods of plating gold layers on nickel containing substrates.

18 Claims, No Drawings

ELECTROLESS GOLD PLATING SOLUTION AND PROCESS

This application claims the benefit of U.S. Provisional Application(s) No.: 06/117,715 Filing Date Jan. 27, 1999.

BACKGROUND OF THE INVENTION

Composite coatings of electroless nickel-phosphorous or nickel-boron followed by a thin coating of immersion gold have been used successfully as solderable finishes on fine pitch, high density circuitry. The nickel deposit serves as a diffusion barrier to the underlying copper while the gold acts as a noble metal protective layer to inhibit the underlying nickel deposit from oxidation.

All electroless immersion processes, also referred to as displacement or replacement processes, depend on the oxidation of the less noble metal surface to supply electrons for the reduction of the more noble metal from solution. As such, all immersion processes can be considered as a combination of corrosion of the one metal with balanced reduction of another driven by the thermodynamic potential couple between them. The reaction continues until a uniform coating of the more noble metal is produced on the substrate surface, sealing off the corrosion sites and neutralizing the potential difference between them. In the case of electroless nickel/immersion gold, the nickel deposit is oxidized and dissolves into solution while the gold in solution is reduced to metal on the nickel surface.

Under certain conditions that are not yet fully understood, the nickel surface can undergo particularly high levels of corrosion during the gold displacement reaction, giving rise to a dramatic structural transformation of the nickel surface. The corroded nickel surface generally is black in appearance and, in cases where electroless nickel-phosphorous is used, the nickel surface is found to contain excessively high amounts of phosphorous. Recently, the term "black nickel" has been coined to describe this particular phenomena. One of the more damaging results of this effect is a loss in solderability due to the inability of the black nickel deposit to be properly wetted with solder. This in turn can lead to weak and unreliable solder joints between the component to be soldered and the plated pads of the printed circuit board.

It is believed that in order for this effect to occur, a potential gradient between surface features on the circuit board must exist, with some features acting anodically relative to others. The galvanic difference observed between features could be caused by a designed capacitance that is built into the various layers or planes of a multilayer circuit board, or by the natural potential difference that exists between two dissimilar metals, which in this case would be nickel and gold. At the very initial stages of gold deposition onto nickel, there will be exposed areas of both nickel and gold. A galvanic cell between the two dissimilar metals could be created, whereby the nickel will be anodically attacked. The corrosion that results is sometimes referred to as "bipolar attack".

In addition to the possibilities stated above, a relative difference in surface activity/passivity between adjacent features resulting from slight variations in surface cleanliness of the features could also promote the occurrence of a similar corrosion reaction.

Gold is also used to protect the electroless nickel plated circuitry from oxidation during storage, thereby better ensuring the nickel will be solderable during the component assembly process. When a galvanic difference as described above exists, certain features such as fine pitch surface mount or ball grid array ("BGA") pads can undergo an accelerated anodic corrosion during processing in the conductive immersion gold solution, consequently increasing substantially the dissolution rate of the nickel deposit. Simulation tests have shown that when a sufficient anodic potential is externally applied to a nickel plated circuit board while in the immersion gold solution, "black nickel" will occur.

Thus, there is a need for improvements in this area in order to avoid or minimize "black nickel" as well as to improve the solderability of the resultant deposit.

SUMMARY OF THE INVENTION

The present invention provides an aqueous electrolyte composition for immersion plating of gold onto a substrate including one or more water soluble gold compounds, one or more organic conductivity salts, one or more reducing agents, and water.

The present invention also provides a method of producing gold coatings on nickel including the step of contacting a substrate including nickel with an immersion gold plating solution including the electrolyte described above.

The present invention further provides a method for manufacturing printed circuit boards including the steps of (a) providing a circuit board having a circuit pattern including one or more of traces, holes or lands of copper; (b) optionally covering areas the circuit pattern with a soldermask; (c) contacting the circuit board with an electroless nickel plating solution for a period of time sufficient to obtain an electroless nickel plated circuit board comprising a nickel layer having a thickness in the range of 0.5 to 10 microns; and (d) contacting the electroless nickel plated circuit board with an immersion gold plating solution for a period of time sufficient to provide a gold finish at a thickness sufficient to protect the nickel layer from oxidation, wherein the immersion gold plating solution comprises the electrolyte described above.

DETAILED DESCRIPTION OF THE INVENTION

As used throughout this specification, the following abbreviations shall have the following meanings: g=gram; μm=micron; 1=liter; ° C.=degrees centigrade; and ° F.=degrees Fahrenheit. All numerical ranges are inclusive.

This invention relates to producing a protective immersion gold coating onto nickel containing substrates, such as printed circuit boards, while greatly reducing or eliminating the tendency for excessive corrosion and dissolution of the nickel layer to occur. This in turn improves the solderability of the resulting deposit. An other advantage of the present invention is that "bipolar attack" in the deposit during plating can be virtually eliminated or significantly reduced.

Specifically, the invention relates to electrolyte compositions for use in an immersion gold process used for depositing thin films of gold upon a substrate containing a nickel layer. As used herein, "substrates containing a nickel layer" include substrates having a nickel metal or nickel alloy layer, and preferably a nickel layer. It will be appreciated by those skilled in the art that nickel metal or nickel alloys alone, i.e. not supported on a substrate, may be advantageously gold plated according to the present invention. Any nickel alloy may be advantageously used in the present invention. Suitable substrates include, but are not limited to, printed wiring boards or other electronic devices. Such substrates may be nickel plated electrolytically or electrolessly. It is preferred that the substrates contain an electroless nickel layer. It is further preferred that the electroless nickel layer is plated with conventional electroless nickel-phosphorus or nickel-boron solutions.

The electrolyte compositions of the present invention contain water, one or more water-soluble gold compounds, one or more conductivity salts (or complexing agents) and one or more reducing agents. While not wishing to be bound by theory, it is believed that the conductivity salt complexes trace metal ions in the solution and assists in the electroless deposition of the gold deposit. While not wishing to be bound by theory, it is believed that the function of the reducing agent is to minimize or eliminate the corrosion that could occur through bipolar attack. It is believed that the reducing agent is oxidized sacrificially in preference to the excess dissolution of the base metal which could otherwise cause this defect, as described above. In this regard, and as a general protection against non-uniform dissolution or oxidation of the nickel, it is also contemplated that use of the reducing agent in the processing steps between nickel and gold plating would be beneficial.

Any water-soluble gold compound is suitable for use in the present invention. Suitable gold compounds include, but are not limited to, alkali gold sulfite compounds such as sodium gold sulfite and potassium gold sulfite, ammonium gold sulfite, alkali gold cyanide compounds, such as sodium gold cyanide and potassium gold cyanide, and ammonium gold cyanide. It is preferred that the gold compound is potassium gold cyanide.

It will be appreciated by those skilled in the art that the water-soluble gold salt may be added to the electrolyte composition directly or generated in situ. For example, potassium gold cyanide may be prepared in situ in the electrolyte composition by adding to water an amount of water-insoluble gold cyanide and an amount of potassium cyanide to form the water-soluble potassium gold cyanide.

A wide variety of conductivity salts may be used in the present invention. Suitable conductivity salts include, but are not limited to, alkali metal salts of organophosphonic acids, as disclosed in the Japanese patent application 10-330199, incorporated herein by reference. Additional conductivity salts include, but are not limited to, amine carboxylic acids such as ethylenediamine tetraacetic acid, hydroxy ethyl ethylenediamine tetraacetic acid, diethylene triamine pentaacetic acid, nitrilo triacetic acid and the like; carboxylic acids and derivatives thereof such as citric acid, succinic acid, malic acid, lactic acid, oxalic acid, malonic acid, glutaric acid and maleic acid; and the like.

Any reducing agent which acts as an oxidant in preference to the oxidation of nickel or which is capable of minimizing the tendency for bipolar attack of the nickel layer is useful in the present invention. Suitable reducing agents would be clear to those skilled in the art and include, but are not limited to, any of a wide variety of inorganic compounds, nitrogen containing compounds and derivatives thereof, organic compounds and derivatives thereof, or mixtures thereof having antioxidant activity. Preferred nitrogen containing compounds include hydrazine and hydrazine derivatives such as hydrazine hydrate and hydrazine sulfate, and hydroxylamine and salts or other derivatives thereof such as hydroxylamine sulfate, hydroxylamine hydrochloride, hydroxylamine nitrate, hydroxylamine sulfonate and hydroxylamine phosphate. The salt or other forms of these compounds that are readily soluble in the electrolyte solution are preferred. Other suitable nitrogen bearing compounds include nitrogen compound salts where the nitrogen is not in its highest oxidation state. Suitable compounds of this type include, but are not limited to, nitrites or nitrite containing compounds. Of these, alkali metal nitrites such as potassium nitrite and sodium nitrite and ammonium nitrite are preferred. Additional suitable reducing agents include organic antioxidants such as ascorbic acid, ascorbates and derivatives thereof, tocopherols and derivatives thereof, and formic acid, formates and their derivatives.

The electrolyte compositions of the present invention are typically prepared by combining water, one or more water-soluble gold compounds, one or more conductivity salts and one or more reducing agents in any order. It is preferred that water is first added to a plating tank, followed in order by one or more conductivity salts, one or more reducing agents, and one or more water soluble gold salts.

The gold concentration in the electrolyte composition is typically present in the range of from about 0.25 to about 8 g/l, and preferably from about 1 to about 3 g/l. The conductivity salt in the electrolyte composition is typically present in the range of from about 10 to about 300 g/l, and preferably from about 50 to about 150 g/l. The reducing agent in the electrolyte composition is typically present in the range of from about 0.1 to about 20 g/l, preferably from about 0.2 to about 5 g/l.

The pH of the electrolyte composition ranges from about 4 to about 9, preferably from about 6 to about 8, and more preferably from about 6.5 to about 7.5. The pH of the solution can be adjusted using basic or acidic materials in a manner which is well known by those skilled in the art.

Typically, immersion plating baths containing the electrolyte compositions of the present invention are heated. The operating temperature of such baths is typically in the range of from about 140° (60° C.) to about 210° F. (99° C.), preferably from 180° (82° C.) to 200° F. (93° C.) to 200° F. (93° C.) and more preferably from 185° (85° C.) to about 195° F. (91° C.).

The compositions and processes of the present invention are useful in providing gold layers or coatings disposed on a nickel or nickel alloy layer. Typically, gold layer thicknesses are in the range of about 0.025 micron to about 0.25 micron. It will be appreciated by those skilled in the art that gold layers having thicknesses less than or greater than this range may be successfully plated according to the present invention.

The following examples are intended to illustrate further various aspects of the present invention, but are not intended to limit the scope of the invention in any aspect.

EXAMPLE 1

An electrolyte solution was prepared by combining the following:

| | |
|---|---|
| Gold as Potassium Gold Cyanide | 2 g/l |
| Organic phosphonic acid | 150 g/l |
| Hydrazine hydrate | 0.5 g/l |
| pH | 7 |
| Temperature | 195° F. |
| Immersion Time | 15 minutes |

Gold deposits were produced from the above electrolyte solution by immersion plating onto a nickel plated substrate. The resultant deposits were semi-bright to bright gold, and there were no signs of corrosion to the underlying nickel deposit. Deposit thickness was 4.3 microinches.

EXAMPLE 2

An electrolyte solution was prepared by combining the following:

| | |
|---|---|
| Gold as Potassium Gold Cyanide | 3 g/l |
| Organic phosphonic acid | 100 g/l |
| Hydroxylamine phosphate | 1.5 g/l |
| pH | 6.5 |
| Temperature | 195° F. |
| Immersion Time | 15 minutes |

Gold deposits were produced from the above solution by immersion plating onto a nickel plated substrate. The resultant deposits were semi-bright to bright gold, and there was no signs of corrosion to the underlying nickel deposit. Deposit thickness was 7.7 microinches.

EXAMPLE 3

An electrolyte solution was prepared by combining the following:

| | |
|---|---|
| Gold as Potassium Gold Cyanide | 2 g/l |
| Organic phosphonic acid | 150 g/l |
| Hydrazine hydrate | 0.5 g/l |
| Reaction product between epichlorhydrin and dimethylaminopropylamine | 1 g/l |
| pH | 7 |
| Temperature | 195° F. |
| Immersion Time | 15 min. |

Gold deposits were produced from the above solution by immersion plating onto a nickel plated substrate. The resultant deposits were semi-bright to bright gold, and there were no signs of corrosion to the underlying nickel deposit. Deposit thickness was 2.3 microinches.

EXAMPLE 4

An electrolyte solution was prepared by combining the following:

| | |
|---|---|
| Gold as Potassium Gold Cyanide | 3 g/l |
| Organic phosphonic acid | 100 g/l |
| Hydroxylamine phosphate | 1.5 g/l |
| Reaction product between epichlorhydrin and imidazole | 1.0 g/l |
| pH | 6.5 |
| Temperature | 195° F. |
| Immersion Time | 15 min. |

Gold deposits were produced from the above solution by immersion plating onto a nickel plated substrate. The resultant deposits were semi-bright to bright gold, and there were no signs of corrosion to the underlying nickel deposit. Deposit thickness was 6.4 microinches.

EXAMPLE 5

Comparative

An electrolyte solution was prepared by combining the following:

| | |
|---|---|
| Gold as Potassium Gold Cyanide | 2 g/l |
| Organic phosphonic acid | 150 g/l |
| pH | 7 |
| Temperature | 195° F. |
| Immersion Time | 15 min. |

Gold deposits were produced from the above solution by immersion plating onto a nickel plated substrate. The resultant deposits were semi-bright to bright gold, but there were visible signs of corrosion to the underlying nickel deposit. Deposit thickness was 10.3 microinches.

EXAMPLE 6

Comparative

An electrolyte solution was prepared by combining the following:

| | |
|---|---|
| Gold as Potassium Gold Cyanide | 2 g/l |
| Citric Acid | 150 g/l |
| Ethylenediamine tetraacetic acid | 15 g/l |
| Reaction product between epichlorhydrin and amine derivative | 1.0 g/l |
| pH | 7 |
| Temperature | 195° F. |
| Immersion Time | 15 minutes |

Gold deposits were produced from the above solution by immersion plating onto a nickel plated substrate. The resultant deposits were semi-bright to bright gold, but there were visible signs of corrosion to the underlying nickel deposit. Deposit thickness was 2.3 microinches.

What is claimed is:

1. An aqueous electrolyte composition for immersion plating of gold onto a substrate comprising one or more water soluble gold compounds selected from the group consisting of alkali gold cyanide compounds and ammonium gold cyanide compounds, one or more organic conductivity salts, 0.2 to 5 g/L of one or more reducing agents selected from the group consisting of hydroxylamine, hydroxylamine salts or other hydroxylamine derivatives, alkali metal nitrites, and ammonium nitrite, and water; the composition having a pH of 6.5 to 7.5.

2. The electrolyte composition of claim 1 wherein the conductivity salt is one or more of organic phosphonic acids and derivatives thereof, carboxylic acids and derivatives thereof, and amine carboxylic acids and derivatives thereof.

3. The electrolyte composition of claim 1 wherein the alkali gold compound is potassium gold cyanide.

4. The electrolyte composition of claim 1 wherein the one or more reducing agents are selected from the group consisting of hydroxylamine, hydroxylamine sulfate, hydroxylamine phosphate, hydroxylamine hydrochloride, hydroxylamine nitrate, hydroxylamine sulfonate, sodium nitrite, potassium nitrite, and ammonium nitrite.

5. The electrolyte composition of claim 1 wherein the one or more gold compounds are present in the range of from about 0.25 to about 8 g/l.

6. The electrolyte composition of claim 1 wherein the one or more conductivity salts are present in the range of from about 10 to about 300 g/l.

7. The electrolyte composition of claim 1 wherein the one or more reducing agents are present in the range of from about 0.5 to 1.5 g/l.

8. A method of producing gold coatings on nickel comprising the step of contacting a substrate comprising nickel with an immersion gold plating solution comprising the electrolyte composition of claim 1; wherein bipolar attack of the nickel is reduced.

9. The method of claim 8 wherein the immersion gold plating solution is heated to at a temperature in the range of about 140° F. to about 210° F.

10. A method for manufacturing printed circuit boards comprising the steps of:
  (a) providing a circuit board having a circuit pattern, comprising one or more of traces, holes or lands of copper;
  (b) optionally covering areas of the circuit pattern with a soldermask;
  (c) contacting the circuit board with an electroless nickel plating solution for a period of time sufficient to obtain an electroless nickel plated circuit board comprising a nickel layer having a thickness in the range of 0.5 to 10 microns; and
  (d) contacting the electroless nickel plated circuit board with an immersion gold plating solution for a period of time sufficient to provide a gold finish at a thickness sufficient to protect the nickel layer from oxidation, wherein the immersion gold plating solution comprises the electrolyte composition of claim 1.

11. The method of claim 10 wherein the gold finish thickness is between 0.025 $\mu$m and 0.25 $\mu$m.

12. An aqueous electrolyte composition for immersion plating of gold onto a substrate comprising potassium gold cyanide, one or more organic conductivity salts, 0.2 to 5 g/L of one or more reducing agents selected from the group consisting of hydroxylamine, hydroxylamine salts or other hydroxylamine derivatives, alkali metal nitrites, and ammonium nitrite, and water; the composition having a pH of 6.5 to 7.5.

13. The electrolyte composition of claim 12 wherein the one or more reducing agents are selected from the group consisting of hydroxylamine, hydroxylamine sulfate, hydroxylamine phosphate, hydroxylamine hydrochloride, hydroxylamine nitrate, hydroxylamine sulfonate, sodium nitrite, potassium nitrite, and ammonium nitrite.

14. The electrolyte composition of claim 12 wherein the one or more reducing agents are present in an amount from 0.5 to 1.5 g/L.

15. An aqueous electrolyte composition for immersion plating of gold onto a substrate consisting essentially of potassium gold cyanide, one or more organic conductivity salts, 0.2 to 5 g/L of one or more reducing agents selected from the group consisting of hydroxylamine, hydroxylamine salts or other hydroxylamine derivatives, alkali metal nitrites, and ammonium nitrite, and water; the composition having a pH of 6.5to 7.5.

16. The electrolyte composition of claim 15 wherein the one or more reducing agents are selected from the group consisting of hydroxylamine, hydroxylamine sulfate, hydroxylamine phosphate, hydroxylamine hydrochloride, hydroxylamine nitrate, hydroxylamine sulfonate, sodium nitrite, potassium nitrite, and ammonium nitrite.

17. An aqueous electrolyte composition for immersion plating of gold into a substrate comprising one or more water soluble gold components selected from the group consisting of alkali gold cyanide compounds and ammonium gold cyanide compounds, one or more organic phosphonic acids, 0.2 to 5 g/L of one or more reducing agents selected from the group consisting of hydrazine, hydrazine derivatives, hydroxylamine, hydroxylamine salts or other hydroxylamine derivatives, alkali metal nitrites, and ammonium nitrite, and water; the composition having a pH of 6.5 to 7.5.

18. A method of producing gold coatings on nickel comprising the steps of contacting a substrate comprising nickel with an immersion gold plating solution comprising the electrolyte composition of claim 17; wherein bipolar attack of the nickel is reduced.

* * * * *